United States Patent [19]

Stratil et al.

[11] Patent Number: 4,598,858
[45] Date of Patent: Jul. 8, 1986

[54] COVERING MEANS AND METHOD FOR PROTECTING THE SURFACE OF A SOLDERING BATH

[75] Inventors: Tomas Stratil, Steinhausen; Milos Pisinger, Zurich; Peter Fehr, Zug, all of Switzerland

[73] Assignee: LGZ Landis & Gyr Zug AG, Zug, Switzerland

[21] Appl. No.: 717,241

[22] PCT Filed: Jul. 11, 1984

[86] PCT No.: PCT/CH84/00111
§ 371 Date: Mar. 12, 1985
§ 102(e) Date: Mar. 12, 1985

[87] PCT Pub. No.: WO85/00542
PCT Pub. Date: Feb. 14, 1985

[30] Foreign Application Priority Data

Jul. 15, 1983 [CH] Switzerland ............... 3898/83

[51] Int. Cl.⁴ ............... H05K 3/34; B23K 1/08
[52] U.S. Cl. ............... 228/180.1; 228/214; 228/260; 228/37; 228/40; 118/422
[58] Field of Search ............... 228/180.1, 260, 214, 228/36, 37, 40, 259; 118/422

[56] References Cited

U.S. PATENT DOCUMENTS

| 1,719,512 | 7/1929 | Krembs | 228/259 |
| 2,026,598 | 1/1936 | Taylor | 118/422 |
| 3,914,481 | 10/1975 | Bostrom | 118/422 |
| 4,171,761 | 10/1979 | Boldt | 228/180.1 |

OTHER PUBLICATIONS

Hershberger, Immersible Solder Wave System, IBM Technical Disclosure Bulletin, vol. 20, No. 6, 11/1977.

Primary Examiner—Nicholas P. Godici
Assistant Examiner—C. McKee
Attorney, Agent, or Firm—Marmorek, Guttman & Rubenstein

[57] ABSTRACT

For protecting the surface of a soldering bath a covering means is used which comprises two phases (3,4), which are placed one on top of the other, are not soluble in each other and are liquid at the soldering temperature. The bottom phase (3) is produced by spreading over the top phase (4), which consists of a liquid synthetic polyalphaolefin, a powder of a chemically active component of sebacic acid and/or suberic acid which is solid at room temperature and liquid at the soldering temperature.

10 Claims, 1 Drawing Figure

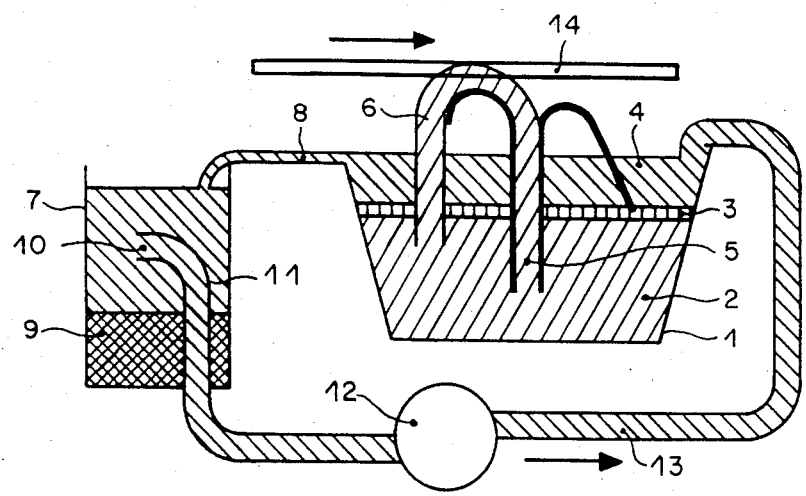

COVERING MEANS AND METHOD FOR PROTECTING THE SURFACE OF A SOLDERING BATH

The invention relates to a method for protecting the surface of a soldering bath and for removing metal oxides in accordance with the generic part of claim 1.

When printed circuit boards are soft soldered by machine, efficient production depends to a large extent on a good soldering bath. In order to protect the surface as much as possible from oxidation and to remove the oxidation products of the liquid solder that are generated primarily in the soldering wave, simple fats, vegetable or mineral oils, esters in the form of oils, or organic acids dissolv in mineral oil have been used as covering means for the soldering bath. The effect of these known covering means on the production process is, however, unsatisfactory, as they either thicken after a short time of use so that they can no longer be used or contaminate the soldering machines with resinous residues. For this reason the covering means must be replaced frequently and the cleaning expense is very high.

It is the purpose of the present invention to create a method for protecting the surface of a soldering bath and removing metal oxides in accordance with the generic part of claim 1, which substantially extends the useful life of the covering means and reduces the material, cleaning and maintenance expenses for the soldering machines as well as the corresponding repair and down times.

This purpose is achieved by the characteristics of claim 1. Solutions of additional partial problems are indicated in the subsequent claims.

The method of the invention is very economical because the useful life of the covering means is several times longer than that of the known covering means, because the time and material required for replacing the covering means are reduced, because of the absence of resinous deposits in the soldering machine and because the viscosity of the covering means does not increase substantially during its use., The method is explained in more detail with the aid of a drawing.

The only FIGURE of the drawing shows schematically a soldering machine consisting of tank 1 for the solder 2 and a covering means for the solder 2, which covering means consists of bottom phase 3 and top phase 4, a duct 5, connected to a pump (not shown in the drawing), for generating a soldering wave 6 and a collecting tank 7. Through the overflow 8, which is located at some distance above the limit of the bottom phase 3 of the covering means, top phase 4 of the covering means can overflow into collecting tank 7. Space 9 is provided at the bottom of collecting tank 7 for accumulating the metal soaps generated in the soldering process. Higher up there is opening 10 of pipe 11, through which top phase 4 is recirculated by means of pump 12 and pipe 13 leading back to tank 1. A printed circuit board 14 is being soldered in the soldering machine.

A heating device (not shown in the drawing) for heating solder 2 is provided in tank 1, which heats the solder to a soldering temperature of, for example, 250° C. In order to protect liquid solder 2 and to remove its oxidation products, provided on top of said solder is bottom phase 3, which is solid at room temperature but liquid at the temperature of liquid solder 2, and liquid top phase 4 of the covering means.

In the method of the invention, phases 3 and 4 of the covering means are separated from each other. The components of the two phases 3 and 4 are not soluble in each other. Bottom phase 3 of the covering means has a higher specific gravity than top phase 4. Bottom phase 3 of the covering means consists of a chemically active component with low vapor pressure, which is able to bind metal oxides of the metal being soldered, and in particular those of solder 2. Organic acids, unmixed or mixed, or their esters, particularly sebacic acid or suberic acid, are suitable for this purpose. They are used in sufficient quantity to ensure that the surface of solder 2 is completely covered by a continuous layer. The amount of non-consumed suberic acid which might be brought in with the flux is not sufficient for this purpose. For this reason most of phase 3 must be added to the covering means separately. A carbohydrate which is immiscible with bottom phase 3 and is stable at high temperatures, preferably a synthetic liquid polyalphaolefin which does not tend to form resinous deposits, is used in top phase 4 of the covering means.

EXAMPLE

The wave soldering machine shown schematically in the drawing is used for mechanical soldering of printed circuit boards 14. Solder 2 contained in tank 1 is preferably covered—up to the level of overflow 8—with a non-aging synthetic liquid polyalphaolefin with a low vapor pressure. Collecting tank 7 is also filled to a predetermined level. Mounds of powdered sebacic and/or suberic acid or their esters in predetermined quantities are placed on the polyalphaolefin. The acid compound melts and forms phase 3, a molten layer on solder 2 which is clearly separate from the polyalphaolefin forming top phase 4. The fact that the overflow 8 is located above the surface of bottom phase 3 ensures that throughout the subsequent soldering process only top phase 4 is circulated from and to tank 1 by means of pump 12 through pipes 11 and 13.

The only action of top phase 4 is that it separates liquid solder 2 from the air and protects it from oxidation. Due to the low vapor pressure of this phase 4 very little smoke is generated and the evaporation loss is very small.

The organic acid of bottom phase 3 of the covering means, which has been added or has been split off from the corresponding ester by the heat, acts as an active chemical component and removes and saponifies the oxides generated in the soldering wave. The metal soap particles generated by this process are not soluble in the polyalphaolefin of top phase 4. They are, however, carried along by that phase 4 when it is recirculated and, because of their higher specific gravity, settle in space 9 close to the bottom of collecting tank 7. The polyalphaolefin decanted through opening 10 of pipe 11 is returned by pump 12 through pipe 13 into tank 1 containing solder 2.

Bottom phase 3 of the covering means is replenished in accordance with the consumption of solder 2, for example twice a week. If the soldering machine is operated at a normal rate, 40 to 80 g of the powder is required per week. After 1½ to 3 months the entire covering means is replaced, which corresponds to a five to tenfold increase of the useful life compared to known covering means. Practically no resinous deposits are generated in the soldering machine. Evaporation loss and obnoxious odors are negligible. Very little time is required for cleaning and maintaining the soldering machine. As a result of the considerably longer useful life, the material costs are much lower than for the known covering means.

We claim:

1. A method for protecting the surface of a soldering bath and for removing metal oxides during mechanical soft soldering of heavy metals, characterized in that a covering means is provided which comprises two phases (3,4), one placed above the other on the soldering both, which are liquid at the soldering temperature, and that the bottom phase (3) has a higher specific gravity than the top phase, the top phase serving to protect said surface from oxidation, the bottom phase including a chemically active component which is able to bind metal oxides in the soldering bath.

2. Method according to claim 1, characterized in that the covering means comprises two phases that (3,4) are not soluble in each other.

3. Method according to claim 2, characterized in that the vapor pressure of the two phases (3,4) is low.

4. Method according to claim 2, characterized in that a powder of an active chemical component which is solid at room temperature and liquid at the soldering temperature is poured in mounds on the top phase (4) to form the bottom phase (3) which is in direct contact with the soldering bath.

5. Method according to claim 4, characterized in that a sufficient quantity of a chemically active component consisting of organic acids or esters, preferably sebacic and/or suberic acid or their esters, is used, so that it covers the solder (2) in the form of bottom phase (3).

6. Method according to claim 5, characterized in that, suberic acid is used; a smaller part is added as the carrier component in a flux and a larger part by pouring the powder on top of phase (4).

7. Method according to claim 2, characterized in that a liquid synthetic polyalphaolefin is used as the top phase (4) of the covering means.

8. Method according to claim 2, characterized in that only the top phase (4) of the covering means is made to circulate through an overflow located at a distance from the surface of the bottom phase (3).

9. Method according to claim 1, characterized in that by means of an opening (10) located above the surface of the settling space (9) of the collecting tank (7) it is ensured that metal soap particles carried along by the recirculated phase (4) settle in collecting tank (7).

10. A soldering bath covering means for protecting the surface of a soldering bath and for removing metal oxides during mechanical soft soldering of heavy metals, said covering means comprising two phases (3,4), one placed above the other on the soldering bath which are liquid at the soldering temperature, the bottom phase (3) having a higher specific gravity than the top phase, the top phase, serving to protect said surface from oxidation, the bottom phase including a chemically active component which is able to bind metal oxides in the soldering bath.

* * * * *